(12) United States Patent
Espino

(10) Patent No.: US 7,593,235 B2
(45) Date of Patent: Sep. 22, 2009

(54) THERMAL CONDUIT

(75) Inventor: Marvin C. Espino, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 490 days.

(21) Appl. No.: 11/490,996

(22) Filed: Jul. 20, 2006

(65) Prior Publication Data

US 2008/0017406 A1    Jan. 24, 2008

(51) Int. Cl.
*H05K 7/00* (2006.01)
(52) U.S. Cl. ............... 361/760; 361/761; 361/772; 361/774; 361/676; 361/697; 361/701; 361/702; 361/704; 174/262
(58) Field of Classification Search ........... 174/252, 174/255, 260, 262, 265, 250, 259, 263, 266; 361/760, 761, 772, 773, 774, 676, 696, 697, 361/701–704, 709–712; 29/842, 843, 840, 29/860, 877, 601, 603.06
See application file for complete search history.

(56) References Cited

U.S. PATENT DOCUMENTS

| | | | | |
|---|---|---|---|---|
| 5,896,271 A * | 4/1999 | Jensen et al. | ................ | 361/719 |
| 5,920,458 A * | 7/1999 | Azar | ................ | 361/704 |
| 6,372,998 B1 * | 4/2002 | Suzuki et al. | ................ | 174/260 |
| 6,434,008 B1 * | 8/2002 | Yamada et al. | ................ | 361/728 |
| 2004/0124002 A1 * | 7/2004 | Mazzochette et al. | ....... | 174/252 |
| 2004/0160731 A1 * | 8/2004 | Yamaguchi | ................ | 361/600 |
| 2006/0126316 A1 * | 6/2006 | Takagi et al. | ................ | 361/775 |

FOREIGN PATENT DOCUMENTS

JP        63069883 A  *  3/1988

OTHER PUBLICATIONS

Package Information, "Thermal Design for Plastic Integrated Circuits," Allegro MicroSystems, Inc., 115 Northeast Cutoff, Box 15036, Worcester, Massachusetts, 01615-0036, Copyright © 1982, 1995, 4 pages.

* cited by examiner

*Primary Examiner*—Jeremy C Norris
*Assistant Examiner*—Hoa C Nguyen
(74) *Attorney, Agent, or Firm*—Blakely Sokoloff Taylor & Zafman LLP

(57) ABSTRACT

A thermal conduit to extract heat from an electrical component on a circuit board is disclosed. An electronic assembly according to aspects of the present invention includes an integrated circuit mounted on a circuit board and a thermal conduit having a first and a second portion. The first portion of the thermal conduit is thermally coupled to one or more electrical terminals of the integrated circuit through an opening defined in the circuit board while the second portion of the thermal conduit is thermally coupled to a first material of the circuit board.

19 Claims, 5 Drawing Sheets

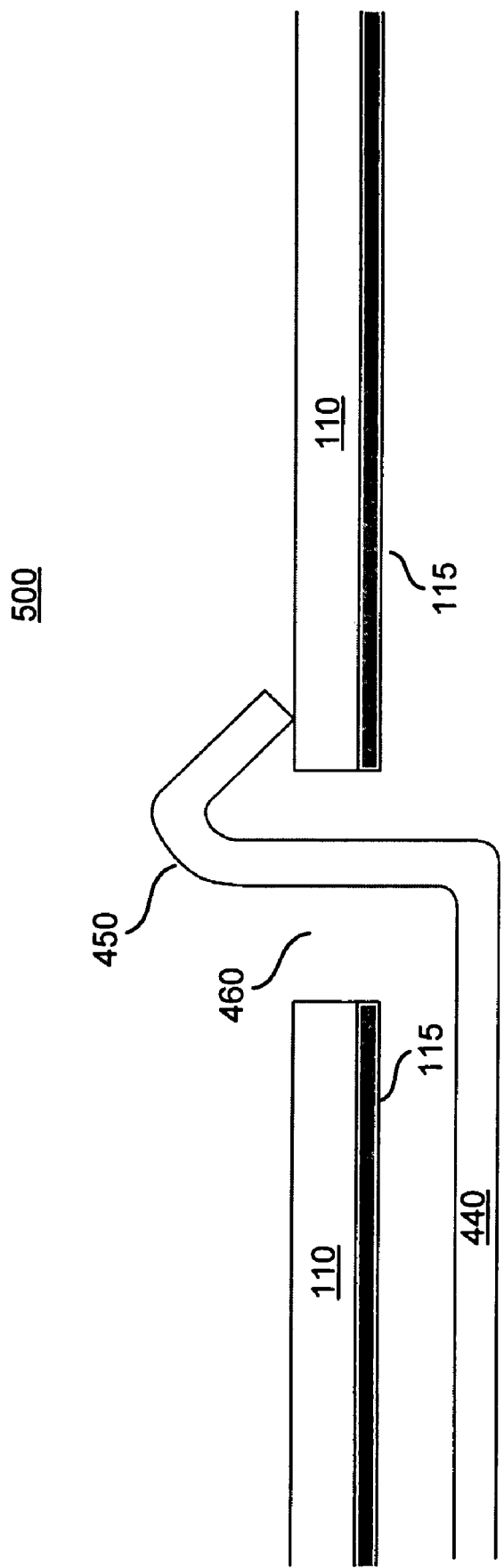

THERMAL CONDUIT

BACKGROUND OF THE INVENTION

1. Field of the Invention

The present invention relates generally to electronics and, more specifically, the present invention relates to a method and apparatus to extract heat from an electrical component on a printed circuit board.

2. Background Information

It is useful to reduce the operating temperature of integrated circuits because high operating temperature degrades reliability. Heat generated in an integrated circuit escapes through the material of the package from regions of higher temperature to regions of lower temperature. The temperature of an integrated circuit depends on the thermal impedance between the integrated circuit and a region of a lower temperature. The flow of heat energy between two points is proportional to the difference in temperature and inversely proportional to the thermal impedance between the two points. Lower thermal impedance corresponds to a lower operating temperature of the integrated circuit for a given power dissipation from the integrated circuit. Heatsinks are often attached to the packages of integrated circuits with mechanical clips or adhesives to reduce thermal impedance.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 5 shows generally a simplified cross-sectional view of an example circuit board assembly including the example thermal conduit of FIG. 4.

DETAILED DESCRIPTION

Methods and apparatuses to extract heat from an electrical component on a circuit board are disclosed. In one example, a low cost thermal conduit apparatus is used to reduce the thermal impedance between the copper cladding of a printed circuit board and the terminals of an integrated circuit package. In one example, the thermal conduit apparatus provides a path of low thermal impedance and low electrical impedance from terminals of the integrated circuit package to the copper, allowing the copper to conduct heat as well as electric current from the terminals of the integrated circuit. Use of the thermal conduit in the assembly of circuit boards may be compatible with ordinary circuit board manufacturing techniques.

In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or subcombinations in one or more embodiments. In addition, it is appreciated that the figures provided herewith are for explanation purposes to persons ordinarily skilled in the art and that the drawings are not necessarily drawn to scale.

As will be discussed, one aspect of the present invention includes a method and apparatus to extract heat from an electrical component such as an integrated circuit having one or more electrical terminals mounted on a circuit board. In one example, a first portion of a thermal conduit having a high thermal and electrical conductivity may be thermally coupled to the one or more electrical terminals of the integrated circuit through an opening defined in the circuit board. A second portion of the thermal conduit may be thermally coupled to a first material in the circuit board.

Figure 1:
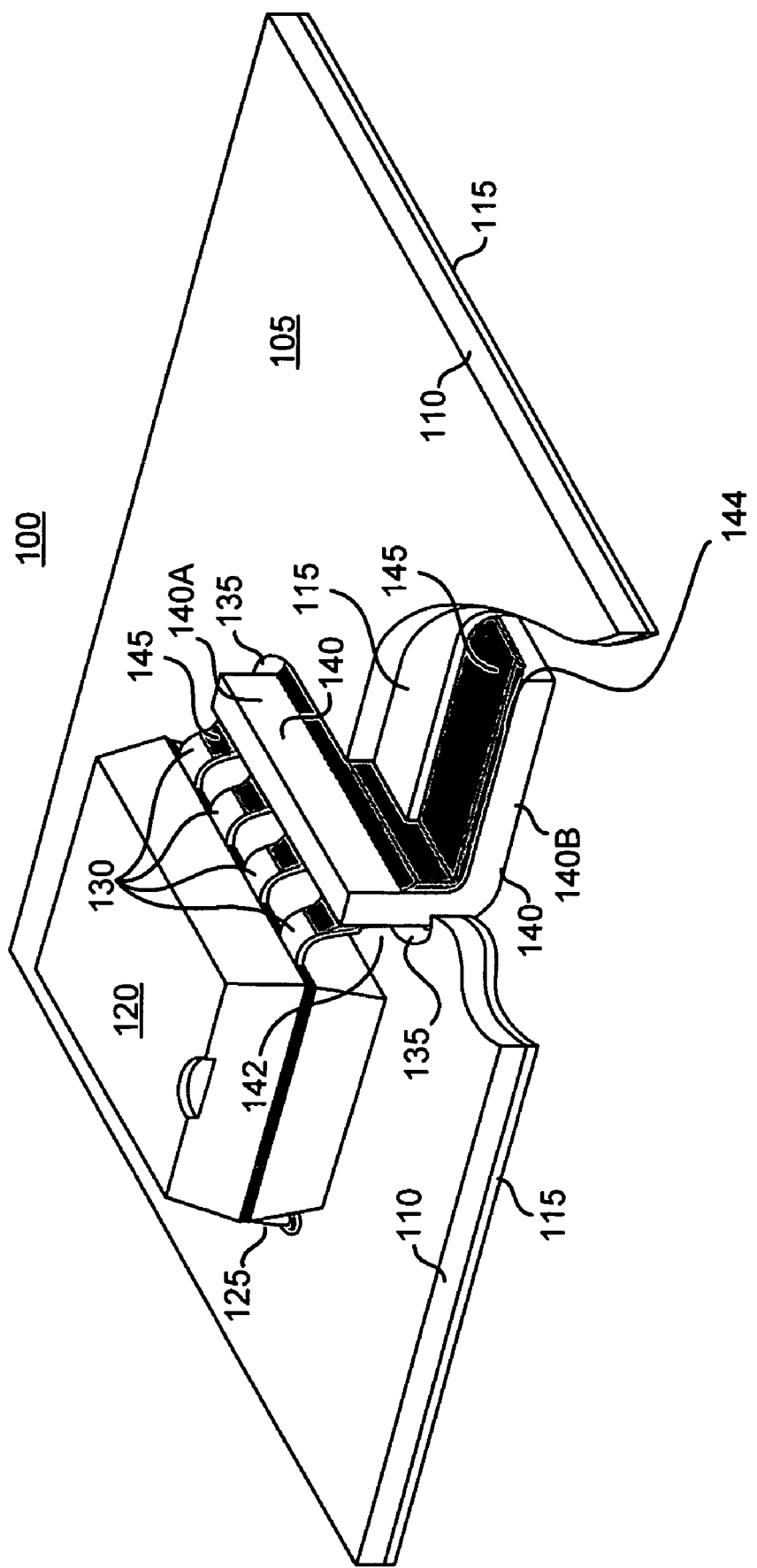
FIG. 1 shows generally a simplified perspective view of an example circuit board assembly including an example thermal conduit in accordance with teachings of the present invention.

To illustrate, FIG. 1 shows a simplified view of a printed circuit board assembly 100 that has an integrated circuit 120 and a thermal conduit 140. The printed circuit board or circuit board 105 includes a layer of electrically insulating material 110 bonded to a first material or layer of electrically conductive material 115. In the example, the layer of electrically conductive material 115 is typically copper of a thickness appropriate for the current that it will conduct, arranged in a pattern to make desired electrical connections between terminals of components on the circuit board 105. The layer of electrically conductive material 115 typically has high thermal conductivity (low thermal impedance) as well as high electrical conductivity (low electrical impedance). The layer of electrically conductive material 115 may occupy a substantial area on an exposed surface of the circuit board 105.

It is common for circuit boards such as circuit board 105 to have electrically conductive material on both top and bottom surfaces of layer of electrically insulating material 110, and even between multiple layers of electrically insulating material 110. Circuit board 105 in the example of FIG. 1 has the layer of electrically conductive material 115 on only one surface of the layer of electrically insulating material 110 to avoid obscuring the example with unnecessary detail. In the example of FIG. 1, electrical terminals or terminals 125 and one or more terminals 130 of integrated circuit 120 pass through openings in circuit board 105 to make electrical connections to layer of electrically conductive material 115 on an opposite surface.

Note that in the example shown, thermal conduit 140 includes a first portion 140A and a second portion 140B. Second portion 140B extends substantially along a plane of a surface of circuit board 105 whereas first portion 140A extends along a plane different from the plane of the surface of circuit board 105. In the example shown, first portion 140A extends along a plane substantially perpendicular to the plane of the surface of circuit board 105. First portion 140A has a first surface 142 that is thermally coupled to terminals 130 through a same opening 135 defined in circuit board 105, while a substantial portion of second surface 144 of second portion 140B is in thermal contact with layer of electrically conductive material 115.

In the example, integrated circuit 120 is designed to operate with terminals 130 coupled to the same electrical potential. Terminals 130 and thermal conduit 140 pass through an opening 135 in circuit board 105. Terminals 130 and layer of electrically conductive material 115 couple to the thermal conduit 140 with a thin layer of solder or other suitable bonding material 145.

Figure 2:
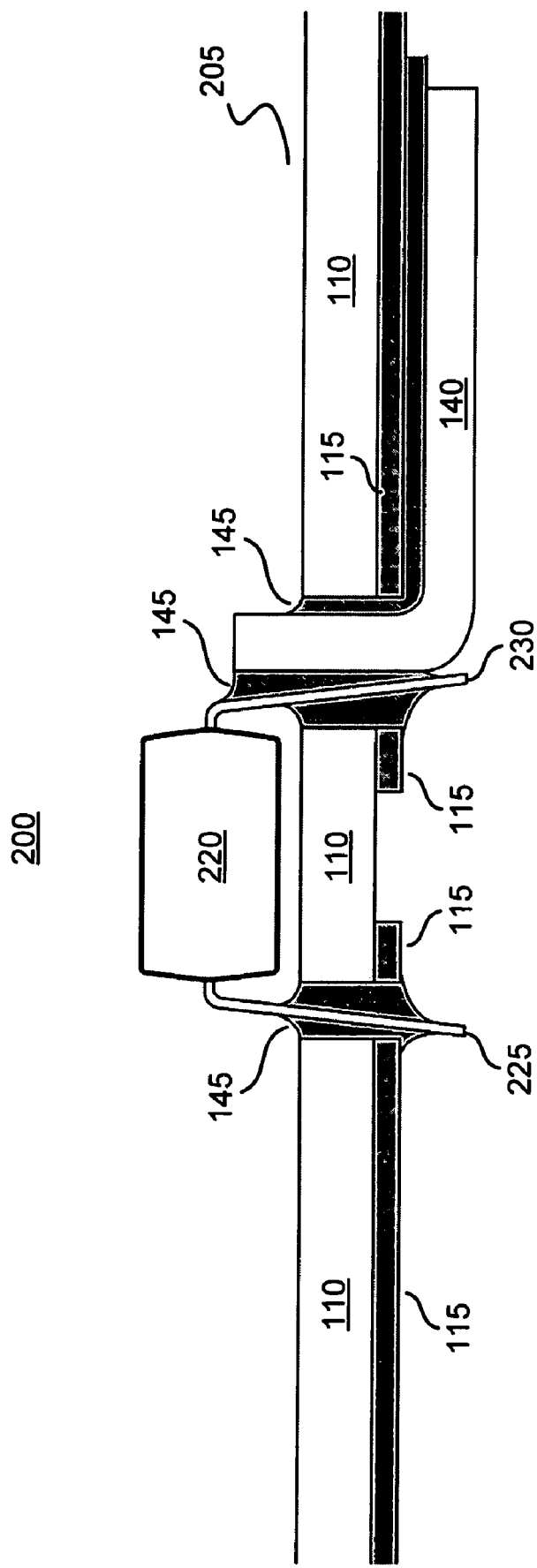
FIG. 2 shows generally a simplified cross-sectional view of an example circuit board assembly including an example thermal conduit in accordance with teachings of the present invention.

FIG. 2 shows a cross section of an example circuit board assembly 200 according to the teachings of the present invention in greater detail. Some dimensions have been exaggerated to emphasize important features of the invention. Layer of electrically insulating material 110 and layer of electrically conductive material 115 are included in a circuit board 205 that provides mechanical support and electrical connections to electrical components such as for example an integrated circuit 220.

Integrated circuit 220 has terminals 225 and 230 that are visible in FIG. 2. In the example, terminal 225 is coupled electrically and thermally to the layer of electrically conductive material 115 by solder or other suitable bonding material 145. The coupling of terminal 225 to layer of electrically conductive material 115 provides sufficiently low electrical impedance to operate integrated circuit 220, but the thermal impedance of the coupling at terminal 225 is much higher than desired. Reducing the thermal impedance would allow more heat to flow from the integrated circuit 220 through terminal 225 to the layer of electrically conductive material 115 removed from circuit board assembly 200 by conduction, convection, or radiation.

An effective method to reduce the thermal impedance between a terminal of an electrical component and electrically conductive material on a printed circuit board with a solder coupling is to use a thermal conduit according to the teachings of the present invention. FIG. 2 shows a thermal conduit 140 coupled between terminal 230 and layer of electrically conductive material 115 by means of solder 145. Thermal conduit 140 allows solder 145 to couple terminal 230 to layer of electrically conductive material 115 over a much greater surface area than the coupling at terminal 225. In various examples, thermal conduit 140 may be a material with high thermal conductivity such as for example at least one or more of copper, aluminum, brass, or steel, with appropriate surface treatment or plating to allow a proper solder bond. In various examples, the bonding material may be a conductive epoxy.

Figure 3:
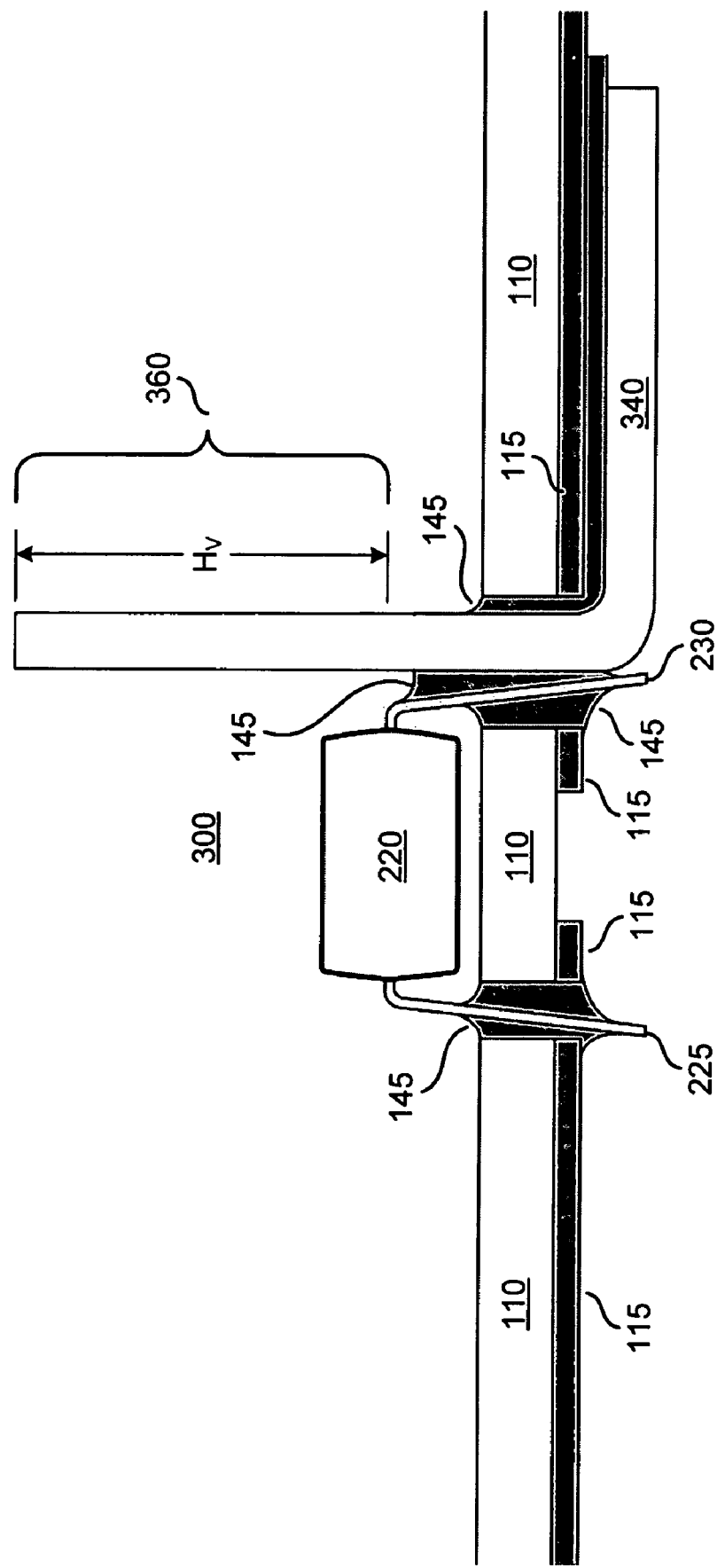
FIG. 3 shows generally a simplified cross-sectional view of another example of circuit board assembly including an example thermal conduit in accordance with teachings of the present invention.

FIG. 3 shows a cross section of an example circuit board assembly 300 that uses a thermal conduit 340 to further reduce thermal impedance in accordance with teachings of the invention. As shown in the illustrated example, thermal conduit 340 extends above or beyond a surface of the layer of electrically insulating material 110 by a height Hv above terminal 230 of integrated circuit 220. An extension 360 of thermal conduit 340 reduces thermal impedance from the terminal 230 of integrated circuit 220 even though the extension 360 is not coupled to the layer of electrically conducting material 115 by the solder 145. Since the material of the thermal conduit 340 has high thermal conductivity, some heat that passes from terminal 230 through the solder 145 into the thermal conduit 340 is conducted into the material of the extension 360 where it is removed by convection or radiation from the surface of the extension 360.

Figure 4:
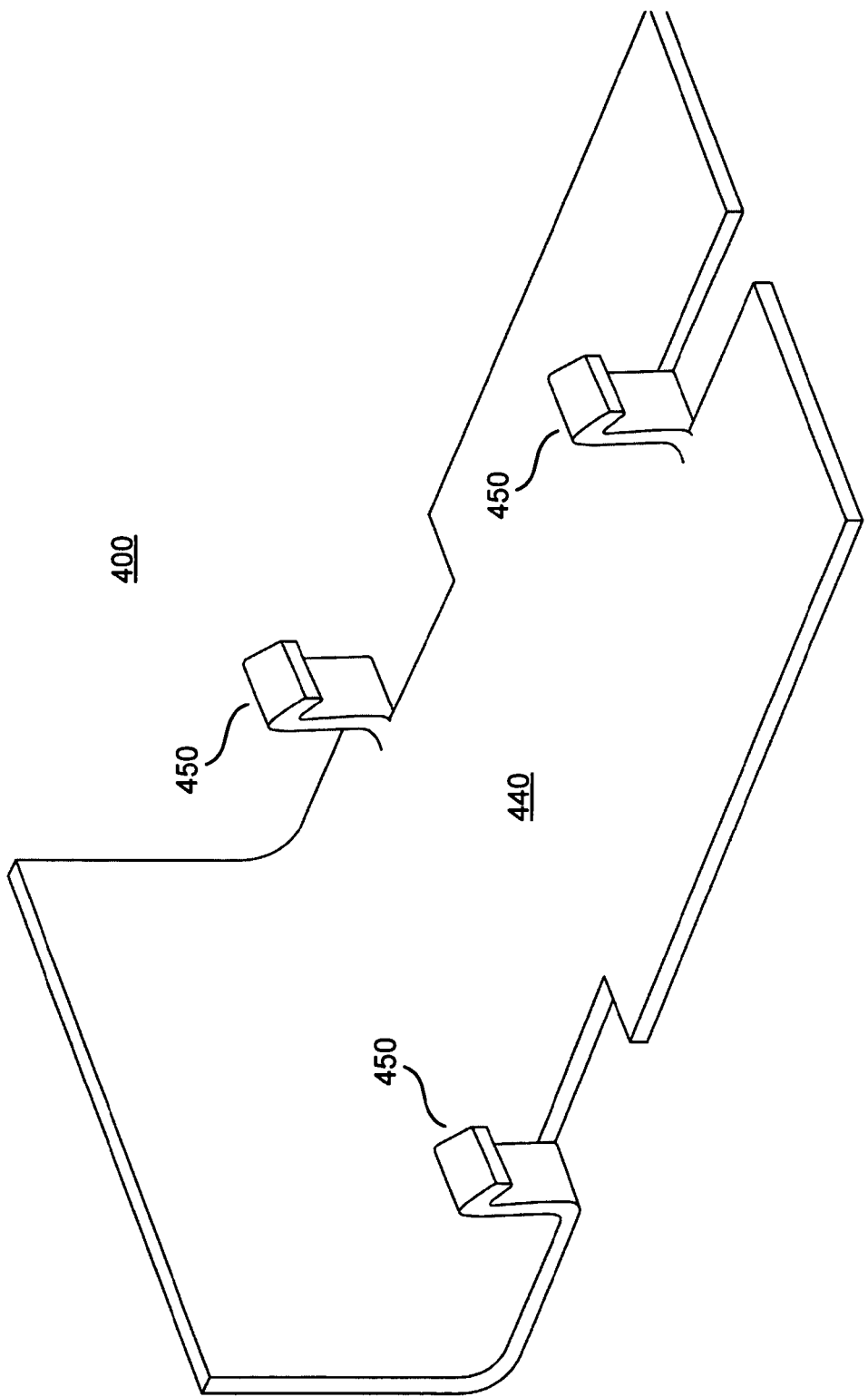
FIG. 4 shows generally a simplified perspective view of an example thermal conduit in accordance with teachings of the present invention.

In one example, to be compatible with automated assembly of components on circuit boards, a thermal conduit would in practice include within its structure a mechanism to hold it in place on the circuit board before it is soldered. FIG. 4 shows one example of a thermal conduit 400 that is formed from a single piece of thermally conductive material 440 with locking tabs 450. In one example, when components are attached to a circuit board, locking tabs 450 pass through openings to keep the thermal conduit 400 in place before and during the soldering operation.

To further illustrate, FIG. 5 is a detail of an example circuit board assembly 500 that shows part of the thermally conductive material 440 formed into a tab structure or locking tab 450 that passes through an opening 460 in a circuit board comprising a layer of electrically insulating material 110 and a layer of electrically conductive material 115. In the example shown, one or more locking tabs 450 may mount or hold the thermal conduit 400 in place on the circuit board in the proper position with other components before and during soldering.

Accordingly, as described, a method includes providing a thermal conduit having a high electrical and thermal conductivity and thermally coupling the thermal conduit to one or more electrical terminals of an integrated circuit. The method further includes coupling the thermal conduit to a first material such as layer of electrically conductive material to lower a thermal impedance between the integrated circuit and copper cladding or electrically conductive material of a circuit board In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An electronic circuit assembly, comprising:
    a circuit board including an opening, a first surface and a second surface, wherein the opening extends through the circuit board from the first surface to the second surface;
    an electrical component having one or more electrical terminals mounted on the circuit board, wherein the one or more terminals passing through the opening;
    a thermal conduit having a first and a second portion, the first portion thermally coupled to the one or more electrical terminals of the electrical component through the opening and the second portion thermally coupled to a first material of the circuit board; and
    bonding material disposed in the opening and between the first portion of the thermal conduit and the one or more electrical terminals, wherein the bonding material abuts the first portion of the thermal conduit, at least, from the first surface of the circuit board to the second surface of the circuit board.

2. The assembly of claim 1 wherein the first material of the circuit board has a high thermal and electrical conductivity and occupies a substantial area on a first exposed surface of the circuit board.

3. The assembly of claim 1 wherein the thermal conduit has a high electrical and thermal conductivity.

4. The assembly of claim 1 wherein the first and second portions of the thermal conduit include a first and a second surface, respectively, the first surface of the first portion being thermally coupled to the one or more electrical terminals of the electrical component and a substantial portion of the second surface of the second portion being in thermal contact with the first material of the circuit board.

5. The assembly of claim 1 wherein the second portion of the thermal conduit extends substantially along the plane of a surface of the circuit board and the first portion of the thermal conduit extends along a plane different from the plane of the surface of the circuit board.

6. The assembly of claim 1 wherein the first portion of the thermal conduit extends in a perpendicular direction from a surface of the circuit board.

7. The assembly of claim 1 wherein the thermal conduit includes a tab structure to mount the thermal conduit on the circuit board.

8. The assembly of claim 1 wherein the bonding material comprises solder to thermally couple the one or more electrical terminals of the electrical component to the thermal conduit.

9. An electronic circuit assembly, comprising:
a circuit board including an opening, a first surface and a second surface, wherein the opening extends through the circuit board from the first surface to the second surface;
an electrical component including an electrical terminal that passes through the opening;
a thermal conduit including a first surface of a first portion of the thermal conduit and a second surface of a second portion of the thermal conduit, wherein the first surface of the first portion is thermally coupled to the electrical terminal of the electrical component and the second surface of the second portion is thermally coupled to a first material of the circuit board; and
bonding material disposed in the opening and between the first surface of the first portion of the thermal conduit and the electrical terminal, wherein the bonding material abuts the first surface of the first portion of the thermal conduit, at least, from the first surface of the circuit board to the second surface of the circuit board.

10. The electronic circuit assembly of claim 9 further comprising solder to thermally couple the second surface of the second portion of the thermal conduit to the first material of the circuit board.

11. The electronic circuit assembly of claim 9 wherein the first material of the circuit board and the thermal conduit include a material having a high electrical and thermal conductivity.

12. The electronic circuit assembly of claim 9 wherein the electrical component comprises an integrated circuit.

13. The electronic assembly of claim 9 wherein the thermal conduit includes a structure to pass through the opening in the circuit board to mount the thermal conduit to the circuit board.

14. The electronic assembly of claim 9 wherein the thermal conduit comprises at least one of copper, aluminum, brass or steel.

15. The electronic assembly of claim 9 wherein the first material includes copper.

16. A method, comprising:
providing a thermal conduit having a high electrical and thermal conductivity;
thermally coupling the thermal conduit to one or more electrical terminals of an integrated circuit included on a circuit board, wherein the one or more electrical terminals pass through an opening included in the circuit board and wherein the opening extends through the circuit board from a first to a second surface of the circuit board, wherein thermally coupling the thermal conduit to the one or more electrical terminals includes disposing a bonding material in the opening and between the thermal conduit and the one or more electrical terminals such that the bonding material abuts the thermal conduit from the first surface of the circuit board to the second surface of the circuit board; and
thermally coupling the thermal conduit to a first material included in the circuit board to lower a thermal impedance between the integrated circuit and the first material included in the circuit board.

17. The method of claim 16 wherein disposing the bonding material comprises providing a solder layer to thermally couple the integrated circuit to the thermal conduit.

18. The method of claim 16 wherein thermally coupling the thermal conduit to the one or more electrical terminals includes thermally coupling a first surface of the thermal conduit to the one or more electrical terminals through the opening.

19. The method of claim 16 wherein thermally coupling the thermal conduit to the first material included in the circuit board includes thermally coupling a surface of the thermal conduit to the first material included in the circuit board.

\* \* \* \* \*

UNITED STATES PATENT AND TRADEMARK OFFICE
CERTIFICATE OF CORRECTION

| | | |
|---|---|---|
| PATENT NO. | : 7,593,235 B2 | Page 1 of 1 |
| APPLICATION NO. | : 11/490996 | |
| DATED | : September 22, 2009 | |
| INVENTOR(S) | : Marvin C. Espino | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 554 days.

Signed and Sealed this

Twenty-first Day of September, 2010

David J. Kappos
*Director of the United States Patent and Trademark Office*